US008533915B2

(12) United States Patent
Duan et al.

(10) Patent No.: US 8,533,915 B2
(45) Date of Patent: Sep. 17, 2013

(54) BUTTON ACTIVATED SPRING-LOADED HINGE ASSEMBLY

(75) Inventors: Chao Duan, Shenzhen (CN); Chia-Hua Chen, Shindian (TW)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 223 days.

(21) Appl. No.: 13/097,217

(22) Filed: Apr. 29, 2011

(65) Prior Publication Data

US 2012/0106039 A1 May 3, 2012

(30) Foreign Application Priority Data

Oct. 29, 2010 (CN) ...................... 2010 1 010525019

(51) Int. Cl.
*E05D 11/10* (2006.01)

(52) U.S. Cl.
USPC ....... 16/326; 16/303; 455/575.3; 361/679.27; 379/433.13

(58) Field of Classification Search
USPC ........ 16/324–332, 297, 303, 334; 455/575.3; 361/679.27; 379/433.13
See application file for complete search history.

(56) References Cited

U.S. PATENT DOCUMENTS

| | | | | |
|---|---|---|---|---|
| 7,237,304 | B2 * | 7/2007 | Duan et al. | 16/324 |
| 7,434,296 | B2 * | 10/2008 | Kubota | 16/330 |
| 7,594,638 | B2 * | 9/2009 | Chan et al. | 248/677 |
| 7,810,214 | B2 * | 10/2010 | Feng et al. | 16/348 |
| 7,814,619 | B2 * | 10/2010 | Kuwajima et al. | 16/303 |
| 7,818,845 | B2 * | 10/2010 | Hu et al. | 16/330 |
| 7,847,194 | B2 * | 12/2010 | Kuwajima et al. | 174/161 R |
| 7,895,710 | B2 * | 3/2011 | Takagi et al. | 16/330 |
| 7,913,358 | B2 * | 3/2011 | Guo et al. | 16/330 |
| 8,006,346 | B2 * | 8/2011 | Zhang et al. | 16/303 |
| 8,370,994 | B2 * | 2/2013 | Duan et al. | 16/330 |
| 2012/0140387 | A1 * | 6/2012 | Luo et al. | 361/679.01 |
| 2012/0149445 | A1 * | 6/2012 | Luo et al. | 455/575.3 |

FOREIGN PATENT DOCUMENTS

CN 101660569 A 3/2010

* cited by examiner

*Primary Examiner* — William Miller
(74) *Attorney, Agent, or Firm* — Altis Law Group, Inc.

(57) ABSTRACT

A hinge assembly includes a first member, a second member, two rotary members, a resilient member, and a main shaft. The first member includes a cam surface. The two rotary members engage with the second member to constitute a latching cam surface engaging with the cam surface. The resilient member provides an elastic force for the first member to abut against the second member. The first member, the second member, the resilient member are placed around the main shaft. After the rotary members are rotated, the first member automatically rotates relative to the second member.

11 Claims, 6 Drawing Sheets

100 80 70 72 60 76 724 12 14 30 24 20 22 122 21 10 16 142 46 40 42 44 52 30 51 50

BUTTON ACTIVATED SPRING-LOADED HINGE ASSEMBLY

CROSS-REFERENCE TO RELATED APPLICATION

This application is related to co-pending U.S. Patent Applications application Ser. No. 13/098,115, entitled "BUTTON ACTIVATED SPRING-LOADED HINGE ASSEMBLY", by Luo et al., which has the same assignee as the present application. The above-identified application is incorporated herein by reference.

BACKGROUND

1. Technical Field

The present disclosure relates to hinge assemblies and, particularly, to a spring-loaded hinge assembly for foldable devices such as portable telephones and portable computers that can be activated by button.

2. Description of Related Art

Some hinge assemblies are spring-loaded to assist in opening the foldable parts of mobile phones, which generally include a cover section and a body section. This kind of hinge assembly includes threaded engagement of its parts and is relatively complicated to manufacture. In addition, the threaded structure needs to be made of costly, high strength material.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the present hinge assembly. Moreover, in the drawings, like reference numerals designate corresponding parts throughout the several views.

DETAILED DESCRIPTION

Figure 1:
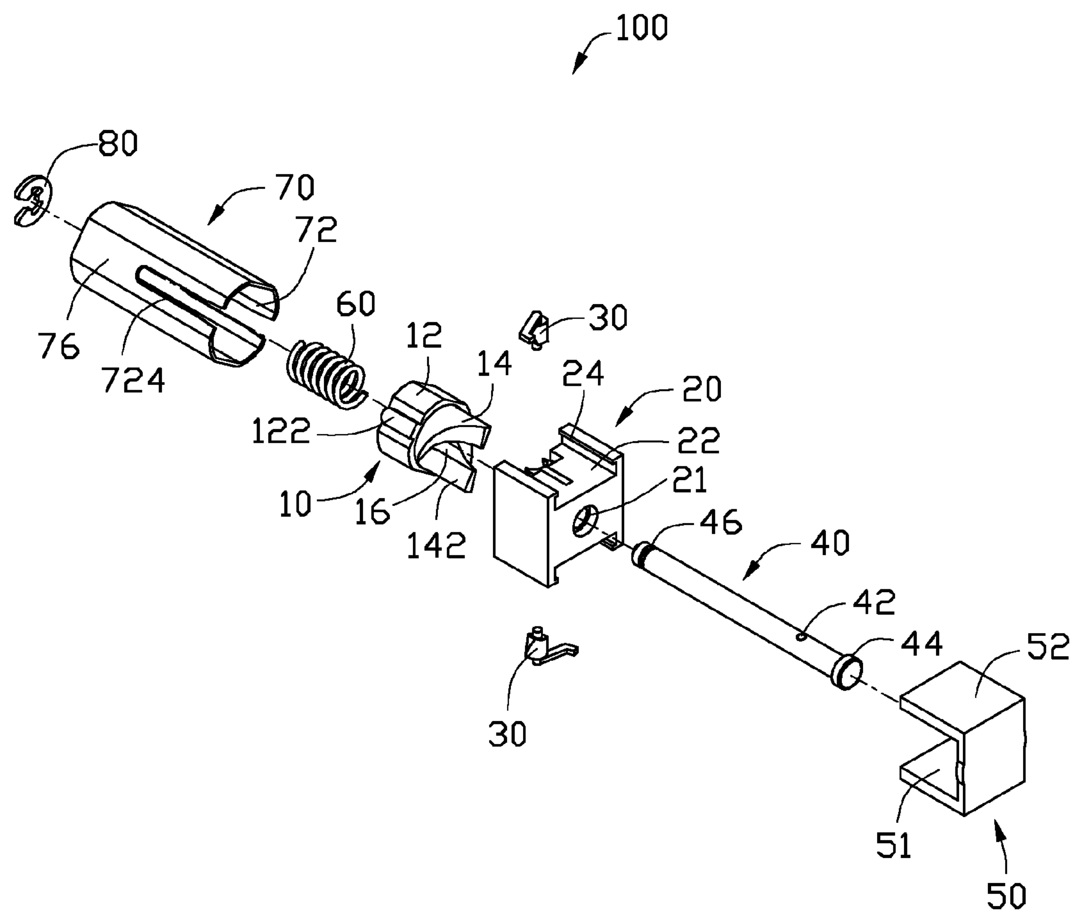
FIG. 1 is an exploded, isometric view of the exemplary embodiment of the hinge assembly shown in FIG. 1.
Figure 2:
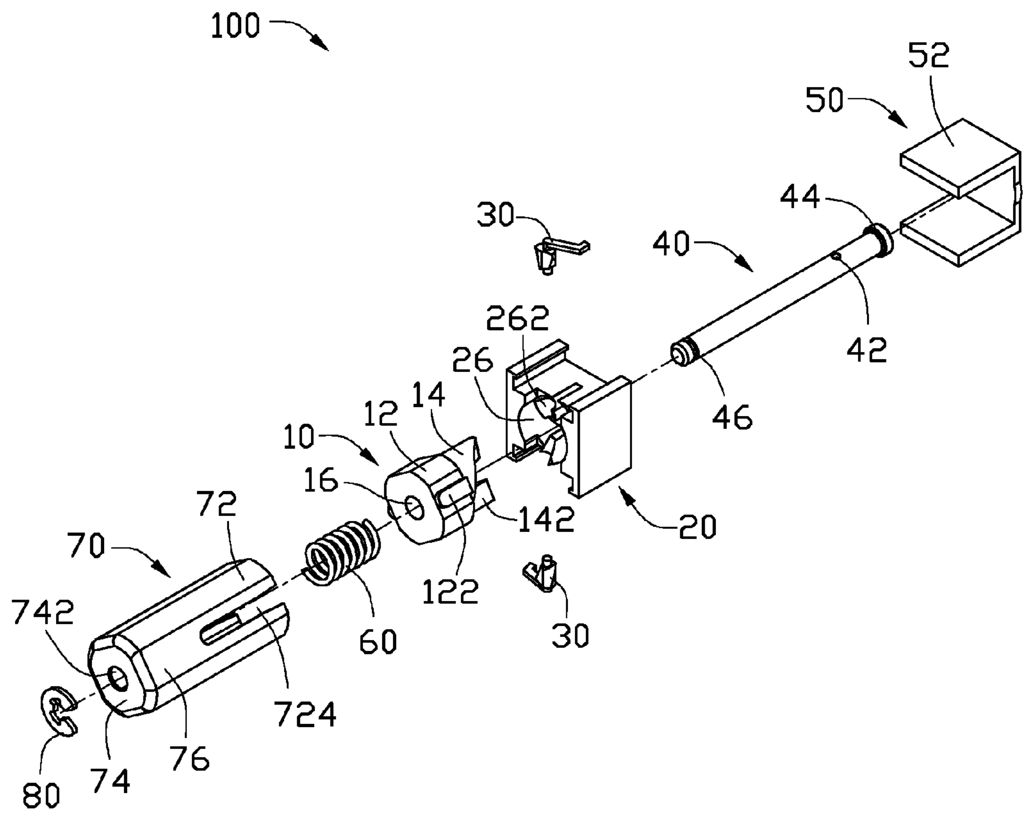
FIG. 2 is similar to FIG. 1, but viewed from another aspect.

Referring to the drawings in detail, FIGS. 1 and 2 show a hinge assembly 100 applied in a foldable electronic device such as a flip type mobile phone. The hinge assembly 100 can be used in other environments (e.g. cabinet doors). Although used here in a foldable electronic device, the hinge assembly 100 should not be considered limited in scope solely to foldable electronic devices.

The hinge assembly 100, in the embodiment illustrated, includes a first member 10, a second member 20, two rotary rods 30, a main shaft 40, a button member 50, a resilient member 60, a sleeve 70, and a washer 80.

The first member 10 coaxially includes a head portion 12 and a cam portion 14 integrally formed together. The head portion 12 includes at least one protrusion 122 for non-rotatably engaging with the sleeve 70. The cam portion 14 is formed at one side of the head portion 12, and has a smaller radius than the head portion 12. The cam portion 14 includes a cam surface 142 with peaks and valleys. An axis hole 16 is defined in the first member 10 to communicate the head portion 12 and the cam portion 14.

Figure 3:
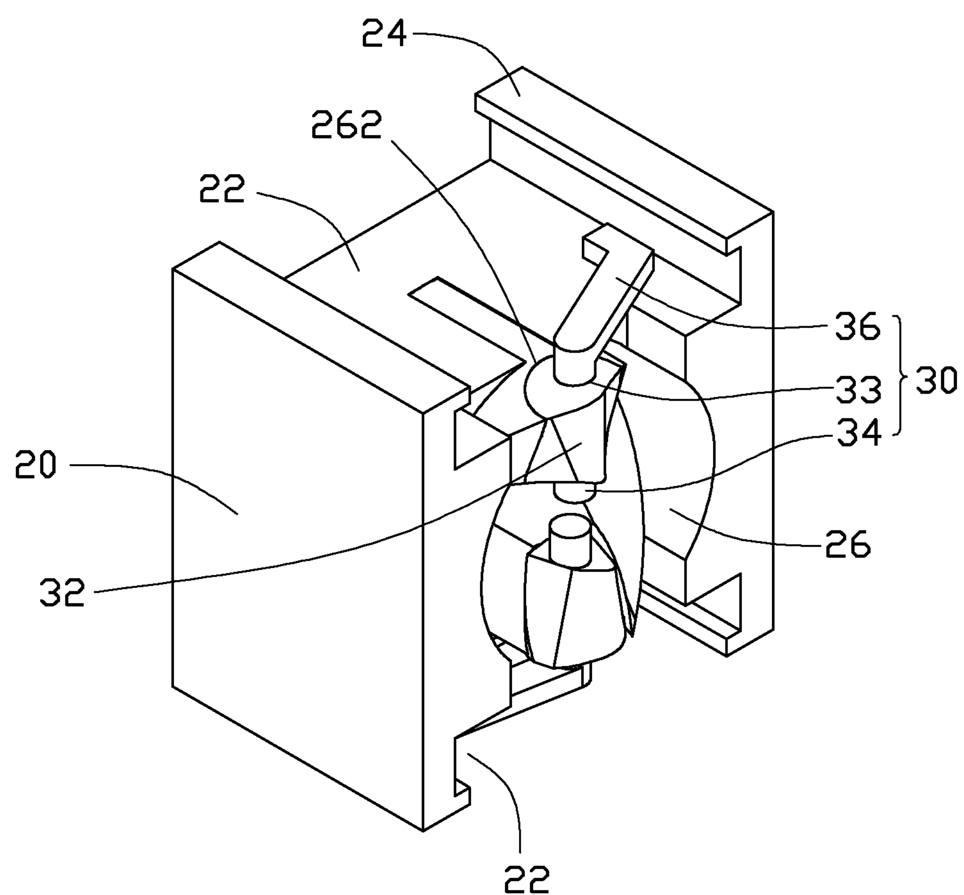
FIG. 3 is a schematic view showing two rotary rods engaging in the second member.
Figure 4:
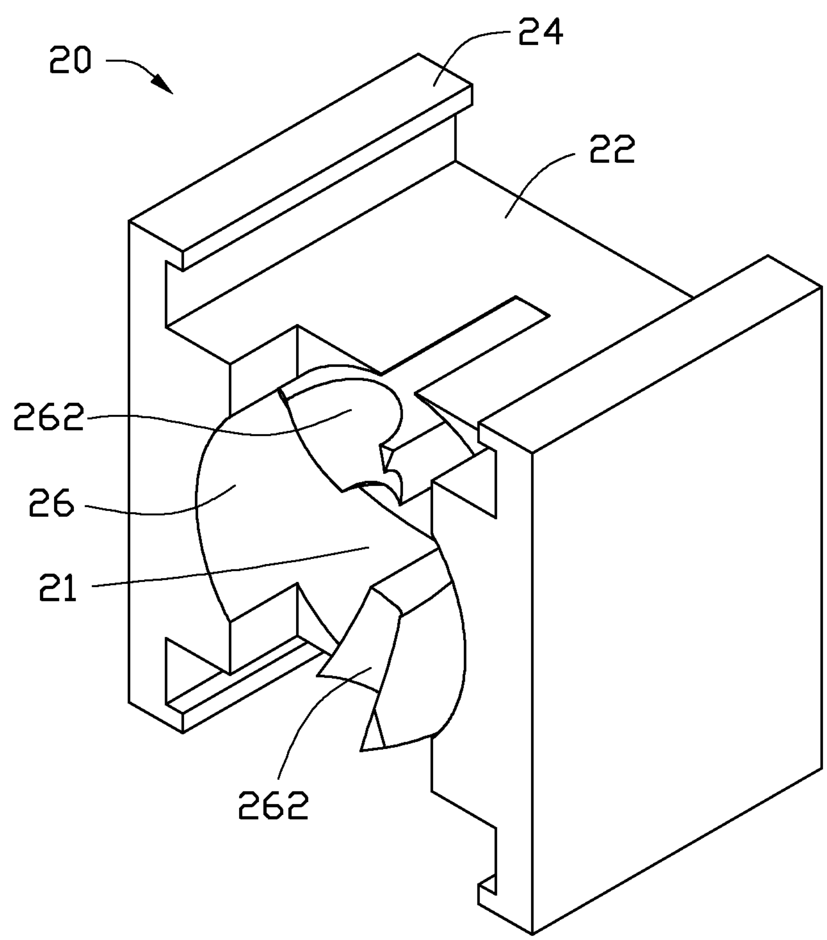
FIG. 4 is an enlarged view of the second member.

Referring to FIG. 3, the rotary rods 30 are engaged with the second member 20 to form a latching cam surface 32 engaging with the cam surface 142. Referring to FIG. 4, the second member 20 defines a central hole 21. In this exemplary embodiment, the second member 20 is substantially cuboid for engaging with a body section of the mobile phone. Each of opposite sides of the second member 20 defines a slot 22 and two rails 24. A concave portion 26 is formed on one end of the second member 20. Two receiving grooves 262 are symmetrically defined in the concave portion 26 for receiving the rotary rods 30.

Figure 5:
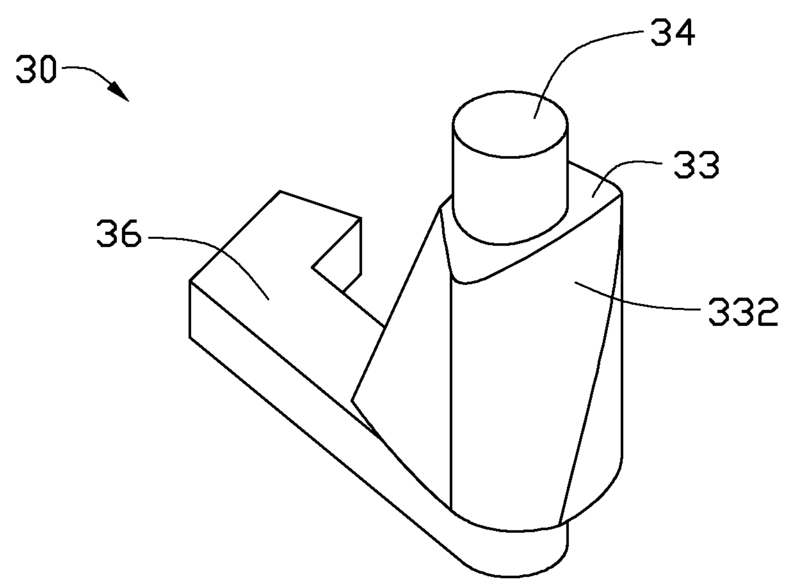
FIG. 5 is an enlarged view of the rotary rod.

Referring to FIG. 5, each rotary rod 30 includes a rotary portion 33, a pivot portion 34 and a handle portion 36. The rotary portion 33 includes an outline surface 332. The outline surface 332 is an irregular shape. The rotary portion 33 is rotatably received in a corresponding receiving groove 262, and one part of the outline surface 332 with the concave portion 26 constitutes the latching cam surface 32. The pivot portion 34 is coaxially positioned at one end of the rotary portion 33. The handle portion 36 is positioned at another end opposite to the shaft portion 34, and received in a corresponding slot 22.

The main shaft 40 extends through, in order, the second member 20, the first member 10, the resilient member 60, and the sleeve 70. The main shaft 40 defines a through hole 42 for receiving the pivot portions 34 of the rotary rods 30. One end of the main shaft 40 forms a flange 44, and the other opposite end forms a locking end 46. The flange 44 prevents the elements on the main shaft 40 from separating from the end of the main shaft 40. The locking end 46 is for locking the washer 80.

The button member 50 is for pushing the rotary rods 30 received in the slots 22 so that the rotary rods 30 can rotate. In this exemplary embodiment, the button member 50 includes opposite extending plates 52 respectively received in the slots 22.

The resilient member 60 can be spiral-shaped (e.g. a coil spring). The resilient member 60 is fit around the main shaft 40, and exerts elastic force on the first member 10 to push the first member 10 toward the second member 20.

The sleeve 70 is a substantially a hollow cylinder, and includes an open end 72 and a partially-closed end 74. The open end 72 defines two guiding grooves 724 for receiving the protrusions 122 to allow the first member 10 to be slidably received in the sleeve 70. The partially-closed end 74 of the sleeve 70 defines a hole 742. Opposite portions of the sleeve 70 are shaped to form a plurality of planner surfaces 76 engaging with a cover section of the mobile phone.

The washer 80 is made of metal, and is engaged with the locking end 46 of the main shaft 40.

Figure 6:
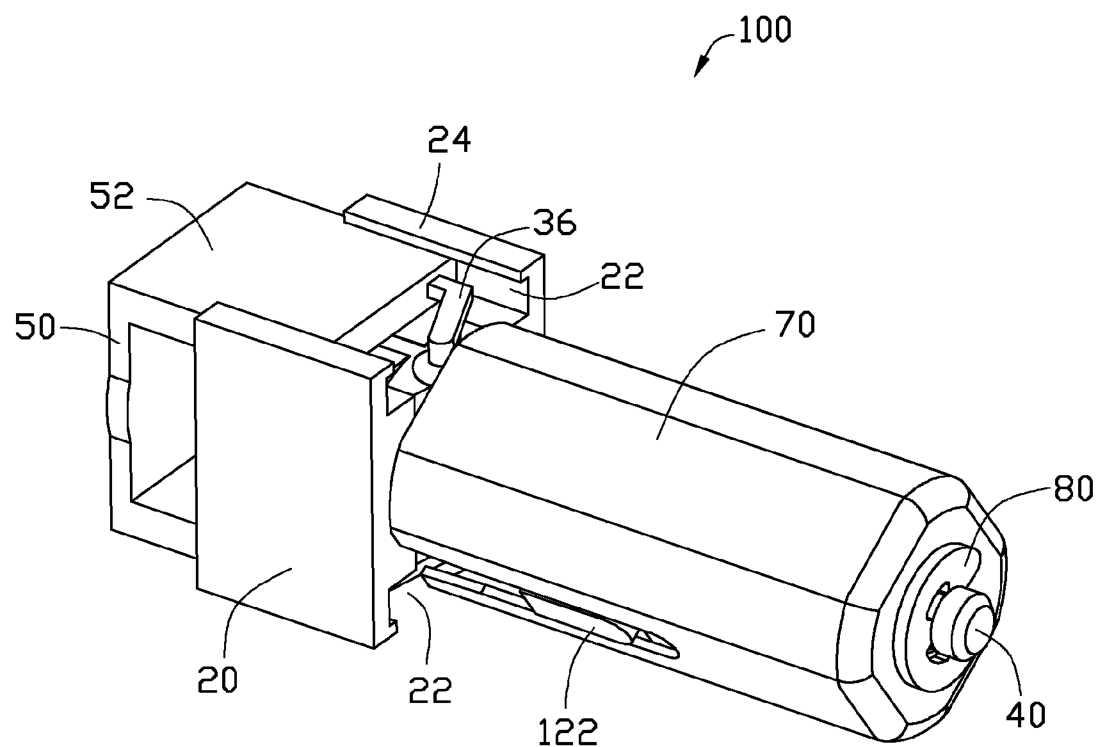
FIG. 6 is an assembled view of the hinge assembly in FIG. 1.

In assembly, referring to FIG. 6, one end of the main shaft 40 extends through the central hole 21 of the second member 20, and each pivot portion 34 of the rotary rods 30 is rotatably received in one of the through holes 42 of the main shaft 40. The rotary portions 33 are received in the receiving grooves 262 of the concave portion 26. The outline surface 332 with the second member 20 constitutes the latching cam surface 32. The handle portions 36 are received in the slots 22 of the second member 20. Then, the first member 10 is fit over the main shaft 40, with the cam surface 142 engaging with the latching cam surface 32. The resilient member 60 is fit over the main shaft 40 from the locking end 46. After the above elements are assembled, the sleeve 70 is placed around the main shaft 40. The protrusions 122 are received in the guiding grooves 724. The partially-closed end 74 of the sleeve 70 resists the resilient member 60, and the locking end 46 of the main shaft 40 extends through the hole 742. The washer 80 is latched on the locking end 46. The extending plates 52 of the button member 50 are received in the slots 22 and abut against the handle portions 36 of the rotary rods 30. The rails 24 prevent the extending plates 52 from separating from the second member 20. Accordingly, the hinge assembly 100 is assembled.

When the cover section is closed relative to the body section, the rotary rods 30 abut against a position of the cam surface 142 adjacent to peaks. To open the mobile phone, a user slightly presses the button member 50. When pressed, the button member 50 moves along an axial direction of the main shaft 40 to bring the handle portions 36 of the rotary members 30 to rotate. The rotary portions 33 are forced to rotate to a predetermined position, e.g., over the peaks of the cam surface 142. Then, even after the button member 50 is released, the first member 10 automatically further rotates relative to the second member 20. Furthermore, the first member 10 rotates the sleeve 70 so that the cover section of the mobile phone is opened.

In this hinge assembly, the moment of force applied to the rotary rods is equal to lever arm multiplying force. When a predetermined moment of force is applied to the rotary rods, the lever arm of the force of pushing the handle portion has a predetermined length, and a small force is enough to push the handle. Thus, users may apply a relatively smaller force on the button member to force the rotary rods to rotate. The operation is easy, and this structure is simple.

It is believed that the present embodiments and their advantages will be understood from the foregoing description, and it will be apparent that different changes may be made thereto without departing from the spirit and scope of the disclosure or sacrificing all of its material advantages, the examples hereinbefore described merely being preferred or exemplary embodiments of the disclosure.

What is claimed is:

1. A hinge assembly, comprising:

a first member including a cam surface;

a second member defining a concave portion at one end thereof, two receiving grooves defined in the concave portion;

two rotary rods engaging with the two receiving grooves of the second member to constitute a latching cam surface engaging with the cam surface;

a resilient member providing an elastic force for the first member to abut against the second member; and a main shaft, wherein the first member, the second member, and the resilient member are placed around the main shaft;

wherein after the rotary rods are rotated to a predetermined position, the first member automatically further rotates relative to the second member.

2. The hinge assembly as claimed in claim 1, wherein the second member defines a slot and two rails at opposite sides for receiving the rotary rods.

3. The hinge assembly as claimed in claim 1, wherein each rotary rod includes a rotary portion, a pivot portion and a handle portion, the pivot portion is coaxially positioned at one end of the rotary portion, and the handle portion is positioned at another end opposite to the shaft portion.

4. The hinge assembly as claimed in claim 3, wherein the rotary portion includes an outline surface, the rotary portion is rotatably received in the second member, and one part of the outline surface with the concave portion constitutes the latching cam surface.

5. The hinge assembly as claimed in claim 3, wherein the main shaft defines through holes for respectively receiving the pivot portions of the rotary rods.

6. A foldable electronic device having at least two components hinged together by a hinge assembly, the hinge assembly comprising:

a first member including a cam surface;

a second member defining a concave portion at one end thereof, two receiving grooves defined in the concave portion;

two rotary rods engaging with the two receiving grooves of the second member to constitute a latching cam surface engaging with the cam surface;

a resilient member providing an elastic force for the first member to abut against the second member; and a main shaft, wherein the first member, the second member, and the resilient member are placed around the main shaft;

wherein after the rotary rods are rotated a predetermined amount, the first member automatically further rotates relative to the second member.

7. The foldable electronic device as claimed in claim 6, wherein each rotary rod includes a rotary portion, a pivot portion and a handle portion, the pivot portion is coaxially positioned at one end of the rotary portion, the handle portion is positioned at another end opposite to the shaft portion.

8. The foldable electronic device as claimed in claim 7, wherein the rotary portion includes an outline surface, the rotary portion is rotatably received in the second member, and one part of the outline surface with the concave portion constitutes the latching cam surface.

9. The foldable electronic device as claimed in claim 8, wherein the main shaft defines through holes for respectively receiving the pivot portions of the rotary rods.

10. A hinge assembly, comprising:

a first member including a cam surface;

a second member including a concave portion formed on one end thereof, at least one receiving groove defined in the concave portion;

at least one rotary rod engaging with the at least one receiving groove of the second member, wherein after the rotary rod is rotated to a position relative to the cam surface, the first member automatically further rotates relative to the second member;

a resilient member providing an elastic force for the first member to abut against the second member; and a main shaft, wherein the first member, the second member, and the resilient member are placed around the main shaft.

11. The hinge assembly as claimed in claim 10, wherein the rotary rod includes a rotary portion, a pivot portion and a handle portion, the pivot portion is coaxially positioned at one end of the rotary portion, and the handle portion is positioned at another end opposite to the shaft portion.

* * * * *